US011561481B2

(12) United States Patent
Murray et al.

(10) Patent No.: US 11,561,481 B2
(45) Date of Patent: Jan. 24, 2023

(54) USING E0 EXPOSURES FOR TRACK/CLUSTER MONITORING

(71) Applicant: International Business Machines Corporation, Armonk, NY (US)

(72) Inventors: Cody J. Murray, Scotia, NY (US); Ekmini Anuja De Silva, Slingerlands, NY (US); Christopher Frederick Robinson, Hyde Park, NY (US); Luciana Meli, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 16/932,983

(22) Filed: Jul. 20, 2020

(65) Prior Publication Data

US 2022/0019139 A1   Jan. 20, 2022

(51) Int. Cl.
*G03F 7/20* (2006.01)
*G03F 7/38* (2006.01)
*G06T 7/00* (2017.01)

(52) U.S. Cl.
CPC .......... *G03F 7/7065* (2013.01); *G03F 7/2004* (2013.01); *G03F 7/38* (2013.01); *G06T 7/0004* (2013.01); *G06T 2207/30148* (2013.01)

(58) Field of Classification Search
CPC ........ G03F 7/2004; G03F 7/38; G03F 7/7065; G03F 7/70625; G03F 7/70558; G06T 7/0004; G06T 2207/30148
USPC .......................................................... 430/30
See application file for complete search history.

(56) References Cited

U.S. PATENT DOCUMENTS

| | | | |
|---|---|---|---|
| 7,343,583 B2 | 3/2008 | Keck et al. |
| 7,373,277 B1 | 5/2008 | Wu et al. |
| 8,284,394 B2 | 10/2012 | Kirk et al. |
| 8,494,802 B2 | 7/2013 | Chen et al. |
| 8,914,766 B2 | 12/2014 | Okamoto et al. |
| 9,436,099 B2 | 9/2016 | Leewis et al. |
| 10,274,836 B2 | 4/2019 | Corliss et al. |
| 10,281,826 B2 | 5/2019 | Corliss et al. |

OTHER PUBLICATIONS

Anuja De Silva et al., "Single-expose patterning development for EUV lithography," Proc. of SPIE, vol. 10143, 101431G, Mar. 2017, 9 pp.
Sandip Halder et al., "Use of surface haze for evaluation of photoresist residue removal efficiency," IEEE Transactions on Semiconductor Manufacturing, vol. 22, No. 4, Nov. 2009, pp. 587-591.
Katsuhiro Fujiyoshi et al., "Direct correlation between electrical failure and haze signals of DF (dark field) inspectors," International Symposium on Semiconductor Manufacturing (ISSM), Oct. 2010, 4 pp.

*Primary Examiner* — Christopher G Young
(74) *Attorney, Agent, or Firm* — Samuel Waldbaum; Michael J. Chang, LLC

(57) ABSTRACT

Techniques for using open frame (E0) exposures for lithographic tool track/cluster monitoring are provided. In one aspect, a method for monitoring a lithographic process includes: performing open frame exposures E0 of at least one wafer coated with a photoresist using a photolithography tool; baking and developing the at least one wafer; performing a defect inspection of the at least one wafer to generate a haze map; grouping haze data from the haze map; and analyzing the haze data to identify a maximum E0 response dose E'.

20 Claims, 9 Drawing Sheets

USING E0 EXPOSURES FOR TRACK/CLUSTER MONITORING

FIELD OF THE INVENTION

The present invention relates to analysis of a photolithographic process, and more particularly, to techniques for using open frame (E0) exposures for photolithographic tool track/cluster monitoring.

BACKGROUND OF THE INVENTION

In a photolithographic tool, a track system provides modules for performing the material-based steps of a photolithographic process such as coating a photoresist on a wafer, baking the photoresist, developing the photoresist, etc. The track system is typically linked to an exposure tool such as a scanner. The track system and linked scanner are oftentimes collectively referred to as a 'photolithography tool cluster' or simply 'cluster.'

In order to ensure the consistency and quality of the output from the tool, it is important to be able to monitor the track/cluster environment and track components. However, monitoring certain components of the track can be difficult and time consuming. For example, monitoring a hot plate can require hours of tool time and wiring of a calibration wafer through the tool. On tools with high levels of work-in-process (WIP) and lower throughput (such as extreme ultraviolet (EUV)), this downtime can cause a large interruption to the fab process for the monitoring time.

Thus, techniques for track/cluster monitoring with no added downtime or inspection equipment costs and minimal process dependency would be desirable.

SUMMARY OF THE INVENTION

The present invention provides techniques for using open frame (E0) exposures for photolithographic tool track/cluster monitoring. In one aspect of the invention, a method for monitoring a photolithographic process is provided. The method includes: performing open frame exposures E0 of at least one wafer coated with a photoresist using a photolithography tool; baking and developing the at least one wafer; performing a defect inspection of the at least one wafer to generate a haze map; grouping haze data from the haze map; and analyzing the haze data to identify a maximum E0 response dose E'.

In another aspect of the invention, another method for monitoring a photolithographic process is provided. The method includes: performing open frame exposures E0 at varying doses across a surface of at least one wafer coated with a photoresist using a photolithography tool; baking and developing the at least one wafer; performing a defect inspection of the at least one wafer to generate a haze map; grouping haze data from the haze map into columns, wherein each of the columns corresponds to one of the doses; analyzing the haze data to identify a maximum E0 response dose E'; determining whether E' has shifted outside of a predetermined E' response range; and taking action to bring E' back into the predetermined E' response range.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for monitoring a photolithographic process using open frame (E0) exposures for automated photolithographic tool track/cluster monitoring and rapid effective dose determination. As highlighted above, the track system of a photolithographic tool provides a variety of different modules for performing the material-based steps of a photolithographic process such as coating a wafer with a photoresist, baking and developing the photoresist, etc. Oftentimes, the track system (or simply 'track') is linked to an exposure tool such as an extreme ultraviolet (EUV) scanner. The combined track and exposure tool are also referred to herein as a 'photolithography tool cluster' or simply 'cluster.'

In general, photolithography involves the patterning of a photosensitive resist material (or photoresist), and then transferring of the pattern from the photoresist to an underlying substrate. In the case of EUV photolithography, patterning of the photoresist is done via a scanner using a range of EUV wavelengths of light. See, e.g., scanner 100 shown in FIG. 1.

Figure 1:
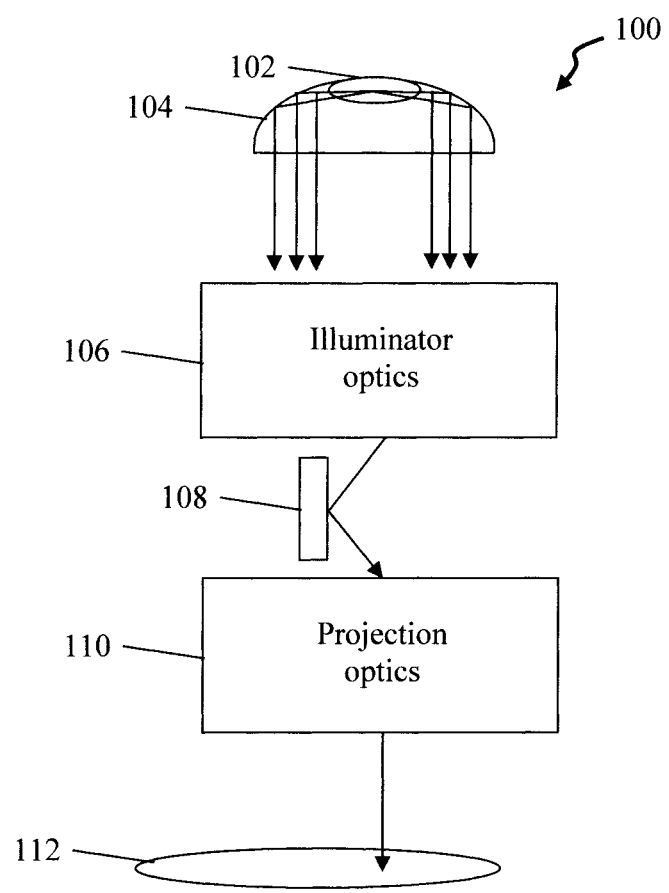
FIG. 1 is a diagram illustrating an exemplary extreme ultraviolet (EUV) scanner according to an embodiment of the present invention.

As shown in FIG. 1, EUV scanner 100 includes an EUV generating plasma source 102 and a collector 104 (reflective optics) for directing light from the source 102 toward illuminator optics 106. As is generally known to those of ordinary skill in the art, the illuminator optics 106 contain a series of mirrors (not shown) off of which the light is reflected in order to generate a certain pupil shape for illuminating a reflective mask 108 with the appropriate amount of light.

Mask 108 can contain a pattern having light reflecting and/or absorbing surfaces. For instance, mask 108 can have a pattern corresponding to an integrated circuit design to be printed on a photoresist-coated wafer 112. The light reflected off of the pattern in mask 108 enters projection optics 110 which projects the light, at the correct angle, onto the photoresist-coated wafer 112. As is generally known to those of ordinary skill in the art, projection optics 110 also contain a series of mirrors (not shown) to direct the light onto the surface of the photoresist-coated wafer 112.

Patterning of the photoresist on wafer 112 by EUV photolithography includes an exposure step whereby the photoresist is exposed to EUV wavelengths of light modulated by the EUV mask 108 pattern. A post-exposure bake or PEB is used to amplify the exposure reaction. The photoresist is then developed to remove the exposed portions of the photoresist (for a positive photoresist) or the non-exposed portions of the photoresist (for a negative photoresist). The result is a patterned photoresist that can then be used as a mask to pattern the underlying wafer 112.

As will be described in detail below, with the present techniques open frame exposures E0 are performed on the photoresist-coated wafer 112 using the exposure tool (e.g., EUV scanner 100) while varying the (scanner-supplied incident) dose across the surface of the photoresist-coated wafer 112. By 'open frame exposures' it is meant that exposure of the photoresist is performed without a mask pattern. For instance, referring to EUV scanner 100, an open frame exposure can be performed using a reflective mask 108 that is fully reflective, i.e., not containing a masking pattern (also referred to herein as an "open frame mask"). In that case, the open frame mask 108 would essentially act as a mirror (with the usual absorber layer removed everywhere from the mask 108) that reflects approximately 100% of the incident EUV illumination to the wafer surface. Dose generally refers to the amount of energy per unit area incident on the photoresist during the exposures.

Following exposure of the wafer 112, the photoresist is baked and developed, and defect inspection of the wafer is performed using a full surface scan of the wafer to generate a haze map. According to an exemplary embodiment, this full surface scan of the exposed wafer is performed using a defect inspection tool that detects and analyzes oblique light scattered from the wafer surface. By way of example only, a commercially-available wafer defect inspection tool such as the Surf-Scan tools available from KLA-Tencor Corporation, Milpitas, Calif., can be employed for the full surface scan of wafer 112. Generally, this type of inspection tool detects defects on wafers using scattered light, and obtains the position coordinates (XY) of the defects. The signal background noise detected during the defect inspection of the exposed wafer is also referred to as 'haze data.' Thus, an XY haze map can be created which represents a collection of the haze data from the full surface of the wafer.

The haze data is grouped and then processed to provide an assessment of E' which is the maximum E0 response dose. E0 response refers to the gray scale value that is assigned for each pixel in the haze map image. The value is then averaged for each field, and each column of the dose stripe. The calculation of E' occurs by plotting the mean gray scale value from the haze map image for each column of the dose stripe, and then determining at what dose the derivative of the $2^{nd}$ order curve fit equals zero (which is why it is called an E'). Advantageously, for a given photoresist stack, E' is a repeatable metric for effective dose. As will be described in detail below, according to an exemplary embodiment, the haze data is grouped by columns, and the mean haze data value for each column is used to directly provide an assessment of E' eliminating the need for image pixel gray scale analysis.

Different process flows can then be set up to monitor different aspects of the photolithography tool and process using this monitoring procedure. For instance, a process flow can be used to monitor the track/cluster environment to detect, e.g., the presence and effects of airborne and/or other contamination in the track/cluster environment. A process flow can be set up to monitor specific hardware components of the track and determine differences in performance of the hardware components such as hot plates for performing the post-exposure bake (PEB). Process flows can also be set up to evaluate materials used in the photolithographic process to determine, e.g., dose sensitivity, post-exposure bake (PEB) sensitivity, etc. Advantageously, these evaluations can be performed rapidly and in an automated manner with little if any downtime or added inspection equipment costs, and with minimal process dependency.

Based on the data obtained from monitoring the various process flows, an automated response can be implemented in real-time. For instance, suppose that the feedback from a process flow indicates that a specific hardware component in the tool has drifted outside of predetermined specifications. As will be described in detail below, this can be accomplished by identifying a specific hardware component (such as a pre-apply bake (PAB) or post-exposure bake (PEB) hot plate) as having a correlation to a particular E' response that is outside of the normal range. In that case, the tool can automatically inhibit and/or adjust the corresponding hot plate.

Figure 2:
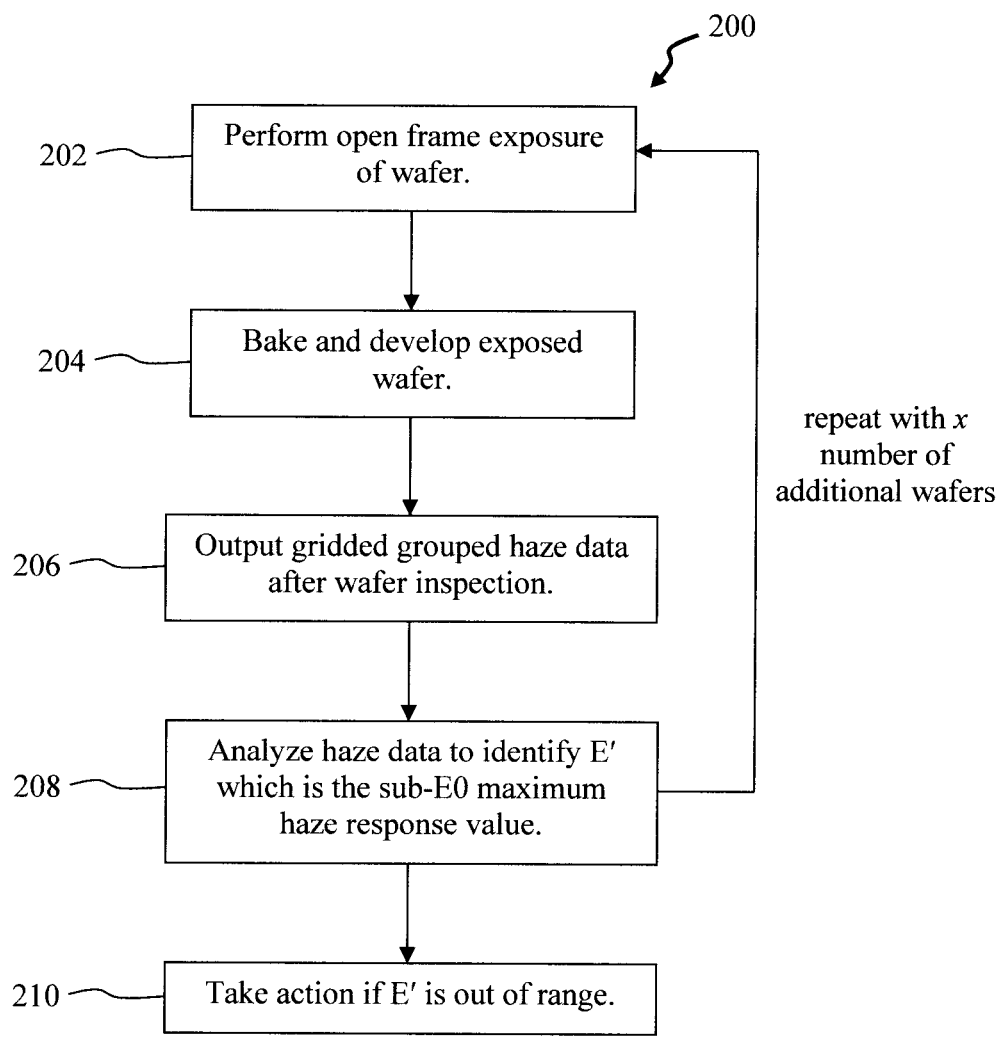
FIG. 2 is a diagram illustrating an exemplary methodology for monitoring a photolithographic process according to an embodiment of the present invention.

Given the above overview, an exemplary methodology 200 for monitoring a photolithographic process in accordance with the present techniques is provided in FIG. 2. In step 202, open frame exposures E0 of a photoresist-coated wafer such as photoresist-coated wafer 112 of FIG. 1 are performed using an exposure tool. In one exemplary embodiment, these open frame exposures are performed in step 202 using an EUV scanner such as the EUV scanner 100 of FIG. 1. As described above, open frame exposures of the photoresist can be performed using an open frame mask (i.e., without a mask pattern) which reflects approximately 100% of the incident EUV illumination to the surface of the photoresist-coated wafer. According to an exemplary embodiment, these open frame exposures are performed with varying doses across the surface of the photoresist-coated wafer. For instance, according to an exemplary embodiment, dose stripe exposures are implemented. With dose stripe exposures, the exposure energy (dose) is changed in each column say a 2% change for each column as an example. See, for example, FIG. 3A, described below. The change in dose will expose more or less of the resist and modulate the haze output from the defect measurement tool accordingly.

In step 204, the exposed photoresist-coated wafer is then baked (a post-exposure bake (PEB)) and developed. As highlighted above, these material-based processes are performed by hardware components in the various different track modules. For instance, the post-exposure bake (PEB) can be performed using hot plates in one or more of the track modules.

Defect inspection of the wafer is then performed using a full surface scan of the wafer to generate a haze map image. As provided above, haze data is the signal background noise detected during the defect inspection. A defect inspection tool such as a Surf-Scan tool detects defects on wafers using scattered light, and obtains the position coordinates (XY) of the defects. Thus, an XY haze map can be created which represents a collection of the haze data from the full surface of the wafer.

Figure 3A:
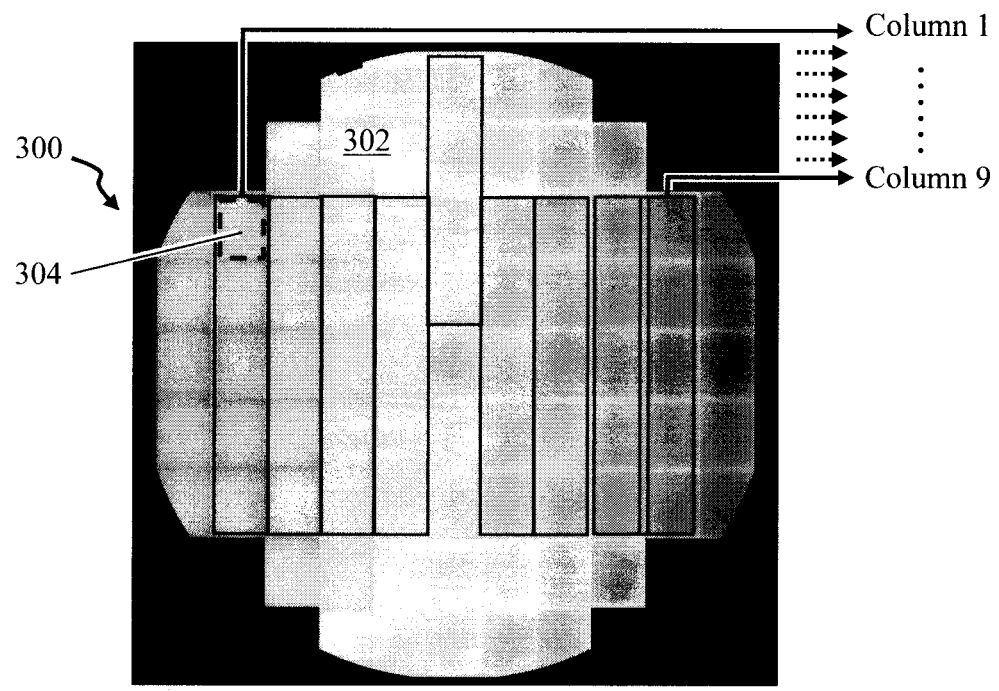
FIG. 3A is a diagram illustrating an exemplary haze map of an E0 wafer following inspection according to an embodiment of the present invention.

In step 206, the haze data from the haze map is grouped. Advantageously, instead of converting the haze data to image gray scale pixels, the inspection haze data is used directly. According to an exemplary embodiment, in order to optimize the haze analysis for the dose stripe exposures (see above), the haze data is grouped by columns. For instance, referring briefly to FIG. 3A, a haze map 300 of a photoresist-coated wafer 302 is shown following inspection. As shown in FIG. 3A, the haze data from various fields 304 across wafer 302 are grouped into columns. See columns 1-9. The center column is shifted to avoid the field in the center of the wafer. That center field is where the resist materials, developer, etc. are all dispensed onto (and which can skew the data). As described in conjunction with the description of step 202 of methodology 200 above, open frame exposures are performed with varying doses across the surface of the photoresist-coated wafer implementing, for example, dose stripe exposures. For instance, looking at FIG. 3A, the columns that are highlighted are actually a set of exposure fields in the vertical direction. To set up a dose stripe exposure, the exposure energy (dose) is changed in each column. The change in dose will expose more or less of the resist and modulate the haze output from the defect measurement tool accordingly. Thus, according to an exemplary embodiment, during the open frame exposures, the same dose is applied to the fields grouped into the same column. For instance, to use the leftmost column (Column 1) as an example, the same dose is applied to each of the fields 304 in Column 1 during the open frame exposures. Similarly, the same dose is applied to each of the fields 304 in the next column to the right (Column 2) during the open frame exposures, and so on. However, the dose applied to the fields in Column 2 is varied from that applied to the fields in Column 1.

Figure 3B:
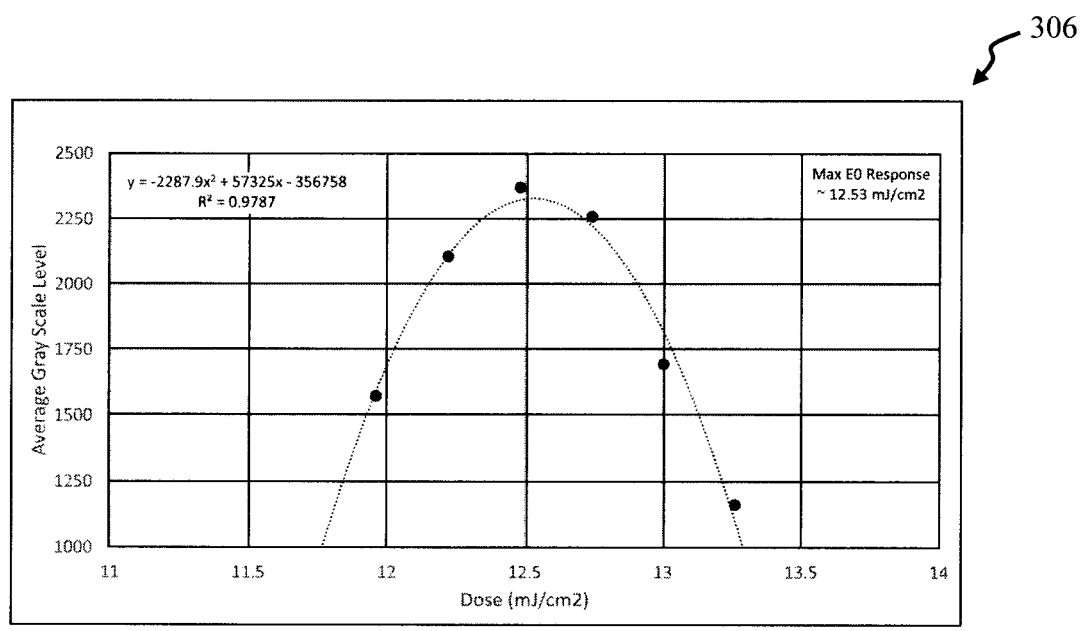
FIG. 3B is a diagram illustrating an exemplary plot of the mean gray scale value according to an embodiment of the present invention.

In step 208, the (column) grouped haze data is then analyzed to identify E' which is the maximum E0 response dose. As provided above, the open frame exposures can be performed with varying doses whereby the same dose is applied to the fields of the wafer that are grouped into the same column. As provided above, a haze value is assigned on the defect inspection tool for each pixel in the haze map. According to an exemplary embodiment, the haze value is averaged for each column of the dose stripe, and the mean haze value is plotted for each column of the dose stripe as a function of the corresponding exposure dose. See, e.g., plot 306 in FIG. 3B. The derivative of the curve that is created is then set to zero to identify E' for a given E0 monitor. Advantageously, grouping of the haze data allows for rapid quantitative analysis of effective dose monitors. As such, the present process is ideal for pervasive track/cluster monitoring with little if any downtime or added inspection equipment costs, and with minimal process dependency.

As shown in FIG. 2, the process can then be repeated with x number of additional wafers. Doing so enables the monitoring of wafer-to-wafer dose variations, and the identification of any (wafer-to-wafer) variation. Based on the analysis, in step 210 a determination is made as to whether E' has shifted outside of the range of a predetermined E' response. For instance, a predetermined E' response can be determined by running a set of E0 monitors and observing the exposure sensitivity and stability. A health range can then be identified based on historical data. If E' has shifted outside of the range of the predetermined E' response, action can be taken to bring the process back into specification, i.e., by bringing E' back into the predetermined E' response range. In some cases, this response action can be automatically implemented in the tool, thereby minimizing any downtime. For instance, when a particular E' response which has drifted outside of the normal range is correlated to a given hardware component such as a hot plate, a correction for that hardware component (e.g., hot plate) can be fed back to the tool in real-time. The hardware component (e.g., hot plate) is corrected by the tool, and its corrected performance is verified against other like hardware components (e.g., other hot plates) in the tool in real-time without stopping production on the tool.

Figure 4:
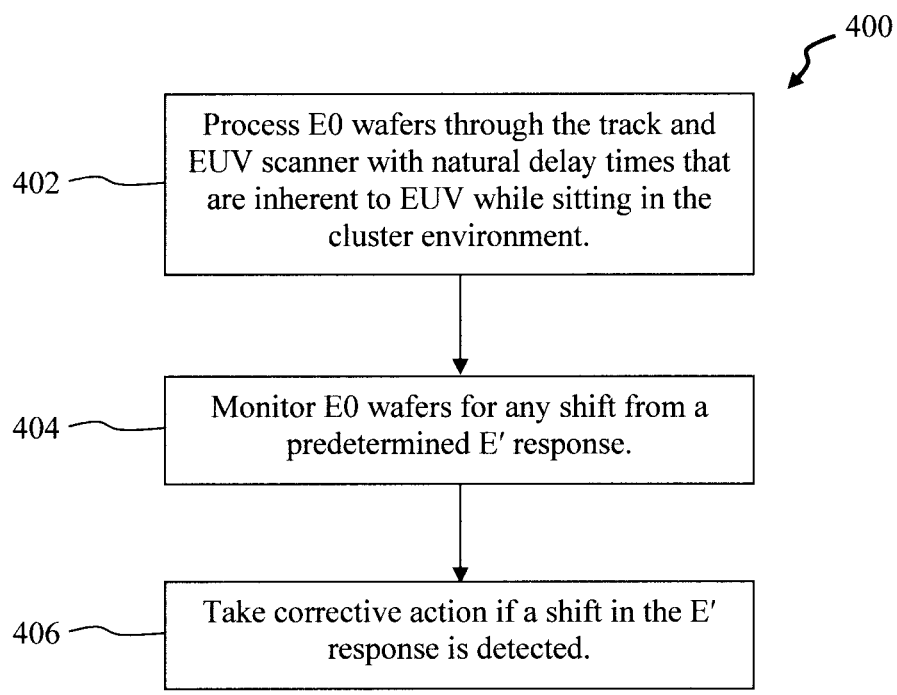
FIG. 4 is a diagram illustrating an exemplary methodology for monitoring contaminants in a photolithographic process according to an embodiment of the present invention.

Different process flows can be set up to monitor different aspects of the photolithography tool and photolithographic process using methodology 100. For instance, in one exemplary embodiment, a process flow can be used to monitor the track/cluster environment for the presence and effects of airborne and/or other contamination in the track/cluster environment. For instance, amine contaminants can undesirably lead to the degradation of photolithographic performance. Amines and other airborne contaminants can come from the ambient air and/or from the environment in which the tool is located. See, for example, methodology 400 of FIG. 4. In step 402, E0 wafers are processed through the track and EUV scanner. The term 'E0 wafers' refers to wafers processed in accordance with steps 202 and 204 of methodology 200 (of FIG. 2) whereby, as described above, open frame exposures E0 of a photoresist-coated wafer are performed using an EUV scanner such as the EUV scanner 100 of FIG. 1. Following E0 exposure, the wafers are then baked and developed. In this particular example, the E0 wafers are processed through the track and EUV scanner experiencing the natural delay times that are inherent to EUV while sitting in the cluster environment. During this time, the E0 wafers are exposed to contaminants, if any, that are present in the cluster environment such as amines.

In step 404, the E0 wafers are monitored for any shift from a predetermined E' response. This monitoring is performed in accordance with steps 206 and 208 of methodology 200 (of FIG. 2) whereby a defect inspection of the wafer is performed using a full surface scan of the wafer by a defect inspection tool such as a Surf-Scan tool which generates a haze map. The haze data from the haze map is grouped, e.g., into columns. The grouped haze data is then analyzed to identify the maximum E0 response dose E' which, for a given resist stack, is a repeatable metric for effective dose.

If a shift in the E' response is detected during the monitoring performed in step 404, then that shift could be correlated to an effective dose change due to environmental contamination such as amine contaminants. For instance, amine contamination in the tool can affect the resist and change the dose sensitivity. When the dose sensitivity is impacted, the E' will shift. A shift in the dose sensitivity for the process will mean that lines are not being resolved correctly which could result in either flop over or breaks. In that case, if a shift in the E' response is detected, in step 406 corrective action is taken. For instance, the tool can be taken off-line for maintenance and cleaning to address the contamination issue.

Figure 5:
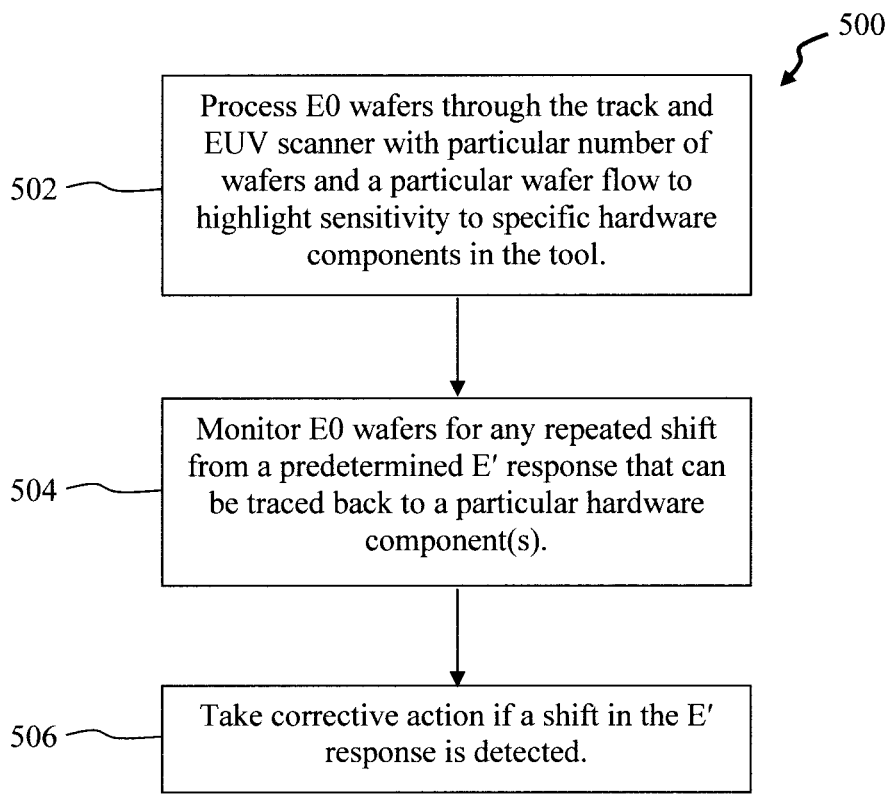
FIG. 5 is a diagram illustrating an exemplary methodology for monitoring hardware components in a photolithographic process according to an embodiment of the present invention.

In another exemplary embodiment, a process flow can be used to monitor specific hardware components of the track to determine if any of the hardware components have drifted out of specification. See, for example, methodology 500 of FIG. 5. In step 502, E0 wafers are processed through the track and EUV scanner in accordance with steps 202 and 204 of methodology 200 (of FIG. 2) whereby, as described above, open frame exposures E0 of a photoresist-coated wafer are performed using an EUV scanner such as the EUV scanner 100 of FIG. 1. Following E0 exposure, the wafers are then baked and developed. In this particular example, a particular number of the E0 wafers are processed through the track and EUV scanner with a particular wafer flow to highlight sensitivity to specific hardware components in the tool. To use an illustrative, non-limiting example, if there are two hot plates (or any module that is being monitored) in a flow and there is only one of everything else (coaters, scanner chucks, etc.), and an every other wafer effect is seen on the monitor, this could be correlated back to one of the two hot plates. The wafer flow is something that can be regulated and modified to be useful for different modules.

In step 504, the E0 wafers are monitored for any repeated shift from a predetermined E' response that can be traced back to a particular hardware component. Thus, for example, if a particular hot plate in the flow shows a shift from normal on each of the wafers that uses it, it can be highlighted as an area of concern. As above, this monitoring is performed in accordance with steps 206 and 208 of methodology 200 (of FIG. 2) whereby a defect inspection of the wafer is performed using a full surface scan of the wafer by a defect inspection tool such as a Surf-Scan tool which generates a haze map. The haze data from the haze map is grouped, e.g., into columns. The grouped haze data is then analyzed to identify the maximum E0 response dose E'. From this, specific hardware components can be identified as having a correlation to a particular E' response that is out of range.

For instance, to use an illustrative non-limiting example, one type of hardware components that can be monitored are the hot plates that are used for baking the exposed E0 wafers. Prior characterization of each of the hot plates can be performed to understand the E' response versus the hot plate temperature change. Namely, the E' response can be predetermined for a range of hot plate temperature changes on each hot plate. Thus, in step 504, any E' response that is outside of the normal range can be correlated to a particular hot plate.

If a repeated shift in the E' response traceable back to a particular hardware component is detected during the monitoring performed in step 504, then in step 506 corrective action is taken. For instance, a hardware correction can be fed back to the tool immediately and verified on a subsequent wafer(s). The hardware can be corrected/adjusted and matched with the other hardware immediately, without stopping production on the tool.

Figure 6:
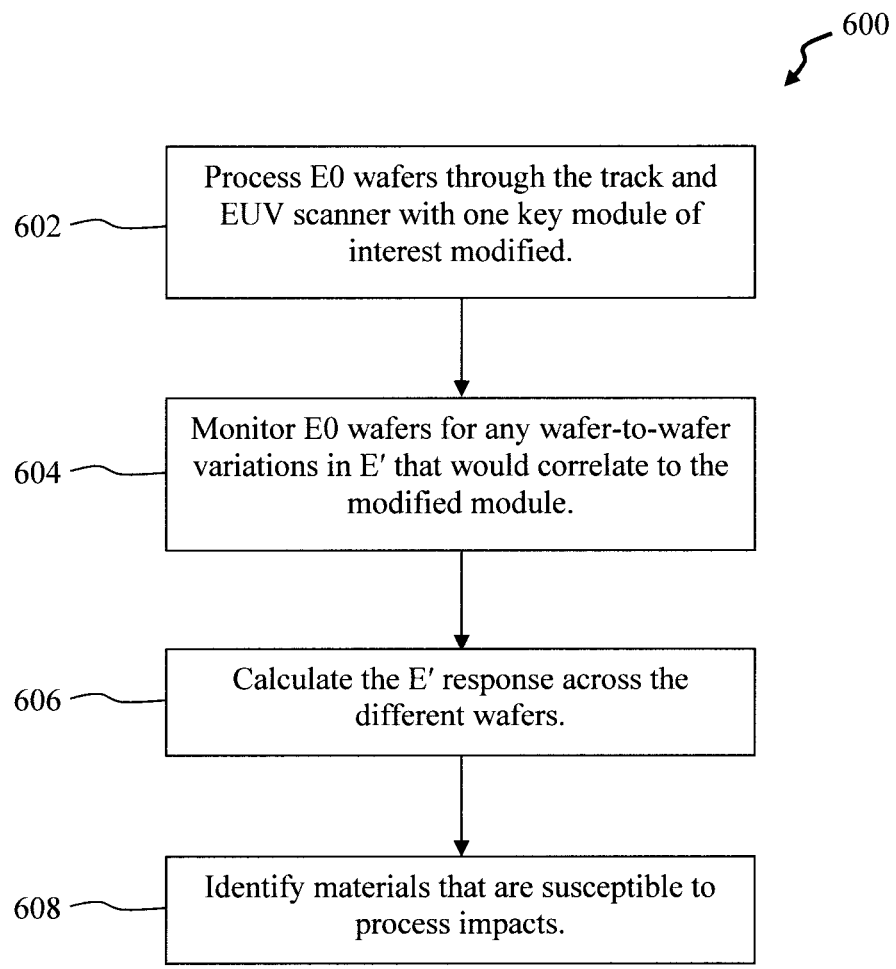
FIG. 6 is a diagram illustrating an exemplary methodology for monitoring materials in a photolithographic process according to an embodiment of the present invention.

In yet another exemplary embodiment, a process flow can be used to monitor materials used in the photolithographic process to determine, e.g., dose sensitivity, post-exposure bake (PEB) sensitivity, etc. See, for example, methodology 600 of FIG. 6. In step 602, E0 wafers are processed through the track and EUV scanner in accordance with steps 202 and 204 of methodology 200 (of FIG. 2) whereby, as described above, open frame exposures E0 of a photoresist-coated wafer are performed using an EUV scanner such as the EUV scanner 100 of FIG. 1. Following E0 exposure, the wafers are then baked and developed. In this particular example, a one key module of interest is modified. For instance, if the robustness of a photoresist to post-exposure bake (PEB) fluctuations is of interest, then one can force a temperature change per wafer on the PEB hot plate.

In step 604, the E0 wafers are monitored for any wafer-to-wafer variations in E' that are correlated to the modification (e.g., PEB temperature change). As above, this monitoring is performed in accordance with steps 206 and 208 of methodology 200 (of FIG. 2) whereby a defect inspection of the wafer is performed using a full surface scan of the wafer by a defect inspection tool such as a Surf-Scan tool which generates a haze map. The haze data from the haze map is grouped, e.g., into columns. The grouped haze data is then analyzed to identify the maximum E0 response dose E'. From this, E' is calculated across the different wafers in step 606.

In step 608, materials are identified that are susceptible to the process modifications. For instance, photoresists that exhibit a greater change in E' from the temperature change are more susceptible to process impacts.

Figure 7:
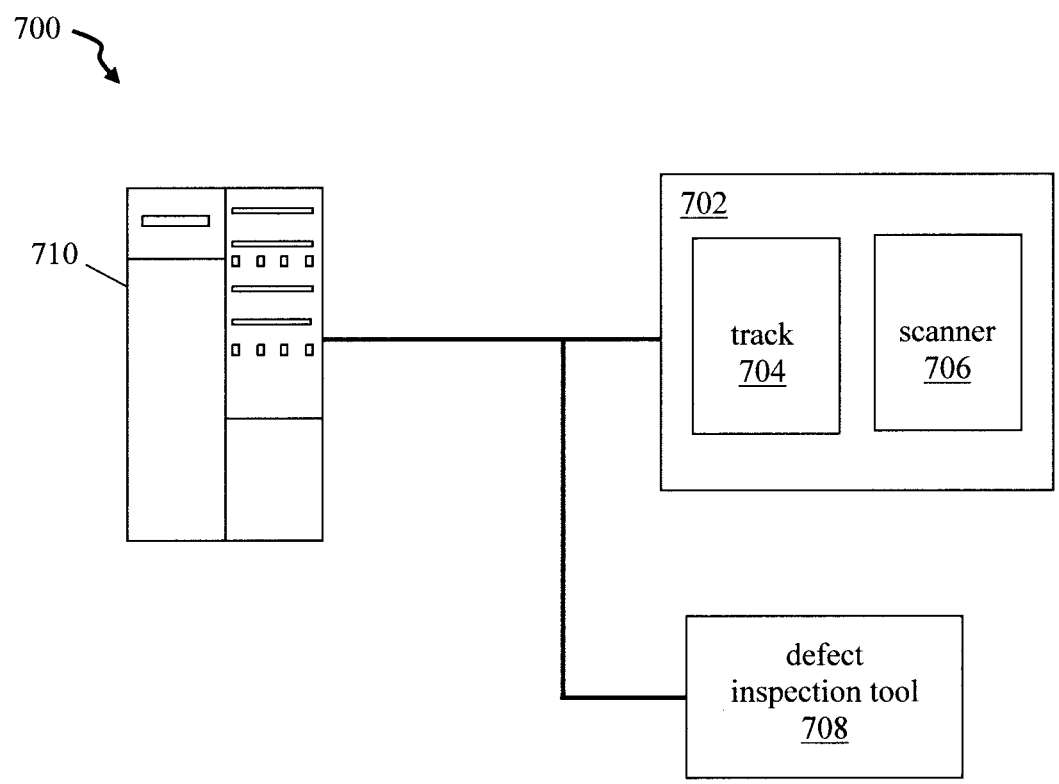
FIG. 7 is a diagram illustrating an exemplary system for monitoring a photolithographic process according to an embodiment of the present invention.

An exemplary system 700 for monitoring a photolithographic process in accordance with the present techniques is shown in FIG. 7. As shown in FIG. 7, system 700 includes a photolithography tool 702 which includes a track 704 and scanner 706, a defect inspection tool 708, and a computer 710 in communication with the photolithography tool 702 and defect inspection tool 708.

As detailed above, track 704 contains modules used for the material-based steps of the process such as coating a wafer with a photoresist, baking and developing the photoresist, etc., and scanner 706 is used for performing the open frame exposures E0 of the wafers. The defect inspection tool 708 (e.g., a Surf-Scan tool) performs a full surface scan of the exposed wafer to generate a haze map.

An exemplary apparatus that can be configured to serve as computer 710 is described in conjunction with the description of FIG. 8, below. Computer 710 receives data from the photolithography tool 702/defect inspection tool 708 for analysis, and also provides (real-time) feedback to the photolithography tool 702. For instance, by way of example only, computer 710 can obtain haze map data from the defect inspection tool 708 from a wafer(s) that have been processed using photolithography tool 702 which performs open frame exposures E0 of the wafer(s) (via scanner 706), and bakes and develops the wafer(s) (via track 704). Computer 710 can then group the haze data, and analyze the haze data to identify a maximum E0 response dose E'. If the E' has shifted outside of the predetermined E' response range, then computer 710 can provide a correction to the photolithography tool in real-time.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 8:
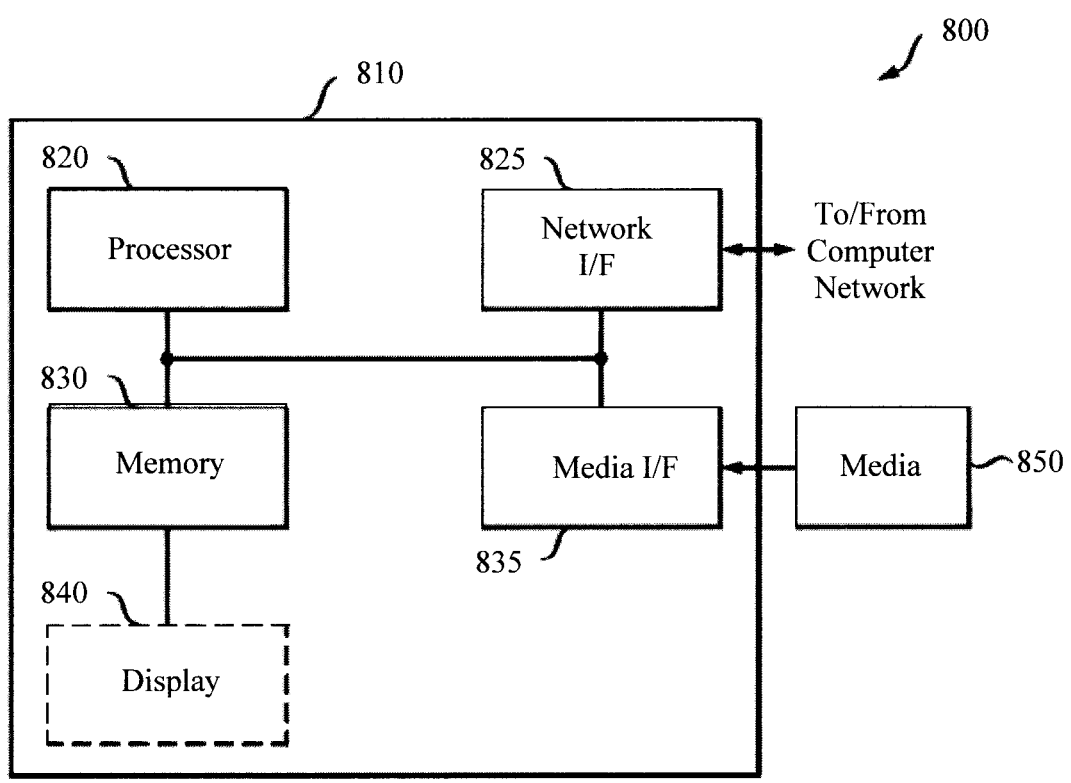
FIG. 8 is a diagram illustrating an exemplary apparatus for performing one or more of the methodologies presented herein according to an embodiment of the present invention.

Turning now to FIG. 8, a block diagram is shown of an apparatus 800 for implementing one or more of the methodologies presented herein. By way of example only, apparatus 800 can be configured to implement one or more of the steps of methodology 200 of FIG. 2. For instance, according to an exemplary embodiment, apparatus 800 can be configured to serve as the computer 710 in system 700 of FIG. 7.

Apparatus 800 includes a computer system 810 and removable media 850. Computer system 810 includes a processor device 820, a network interface 825, a memory 830, a media interface 835 and an optional display 840. Network interface 825 allows computer system 810 to connect to a network, while media interface 835 allows computer system 810 to interact with media, such as a hard drive or removable media 850.

Processor device 820 can be configured to implement the methods, steps, and functions disclosed herein. The memory 830 could be distributed or local and the processor device 820 could be distributed or singular. The memory 830 could be implemented as an electrical, magnetic or optical memory, or any combination of these or other types of storage devices. Moreover, the term "memory" should be construed broadly enough to encompass any information able to be read from, or written to, an address in the addressable space accessed by processor device 820. With this definition, information on a network, accessible through network interface 825, is still within memory 830 because the processor device 820 can retrieve the information from the network. It should be noted that each distributed processor that makes up processor device 820 generally contains its own addressable memory space. It should also be noted that some or all of computer system 810 can be incorporated into an application-specific or general-use integrated circuit.

Optional display 840 is any type of display suitable for interacting with a human user of apparatus 800. Generally, display 840 is a computer monitor or other similar display.

Figure 9A:
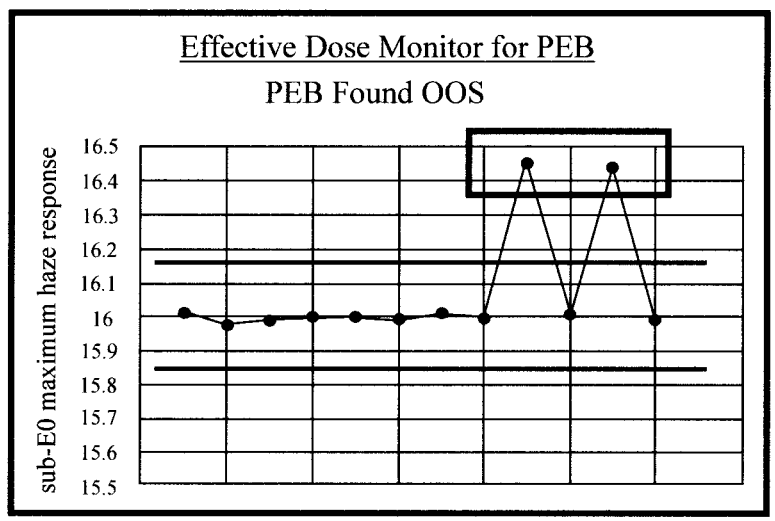
FIG. 9A is a diagram illustrating effective dose monitoring at the hardware level according to an embodiment of the present invention.
Figure 9B:
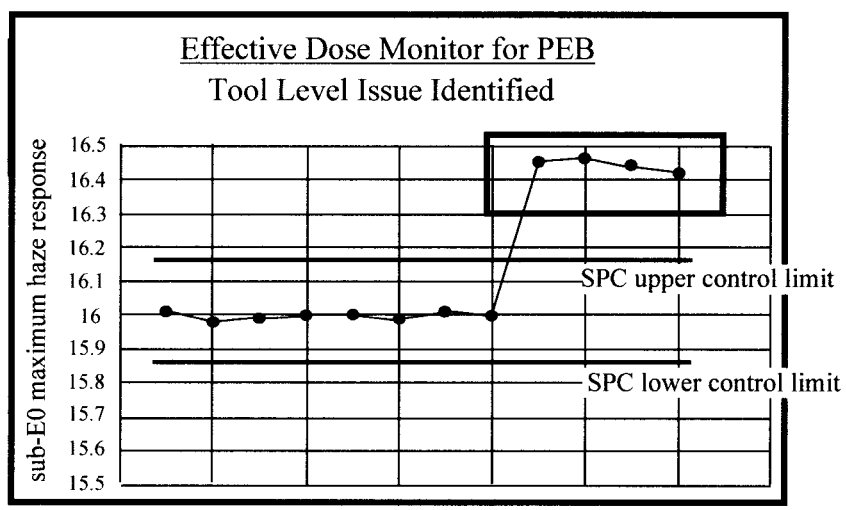
FIG. 9B is a diagram illustrating effective dose monitoring at the tool level according to an embodiment of the present invention.

The present techniques are further illustrated by way of reference to the following non-limiting example(s). As described in conjunction with the description of FIG. 5 above, in one exemplary embodiment, a process flow can be set up to monitor specific hardware components of the track to determine if any of the hardware components have drifted out of specification. To do so, a particular number of E0 wafers are processed through the track and EUV scanner. In this particular example, the process set up includes four wafer monitors running single path except for two hot plates (or any other module that is being monitored). Track VID output identifies which hot plate each wafer processes with as collected data. As shown in FIG. 9A, the process control charts will flag two points out of specification (OOS). The process flow partition identifies a hot plate as drifting out of specification and codes down the hot plate. At the tool level, if the process control charts flag all four wafers as being out of specification then, based on the process setup, this would suggest a tool issue and would code down the cluster.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for monitoring a photolithographic process, the method comprising:
   performing open frame exposures E0 of at least one wafer coated with a photoresist using a photolithography tool;
   baking and developing the at least one wafer;
   performing a defect inspection of the at least one wafer to generate a haze map;
   grouping haze data from the haze map; and
   analyzing the haze data to identify a maximum E0 response dose E'.

2. The method of claim 1, wherein the open frame exposures are performed using an extreme ultraviolet (EUV) scanner.

3. The method of claim 1, wherein performing the defect inspection of the at least one wafer comprises:
   performing a full surface scan of the at least one wafer.

4. The method of claim 3, wherein the full surface scan of the at least one wafer is performed using a defect inspection tool that detects and analyzes oblique light scattered from a surface of the at least one wafer.

5. The method of claim 1, wherein the haze data is grouped into columns.

6. The method of claim 1, wherein the open frame exposures E0 are performed at varying doses across a surface of the at least one wafer.

7. The method of claim 6, further comprising:
   determining a mean haze data value for each of the doses.

8. The method of claim 7, further comprising:
   using the mean haze data value to identify E' for each wafer exposure.

9. The method of claim 1, further comprising:
   determining whether E' has shifted outside of a predetermined E' response range.

10. The method of claim 9, wherein E' has shifted outside of the predetermined E' response range, and wherein the method further comprises:
    taking action to bring E' back into the predetermined E' response range.

11. The method of claim 9, wherein E' has shifted outside of the predetermined E' response range, and wherein the method further comprises:
    correlating shift of E' to a given hardware component of the photolithography tool; and
    providing a correction for the given hardware component to the photolithography tool in real-time.

12. The method of claim 11, further comprising:
    correcting the given hardware component; and
    verifying a corrected performance of the given hardware component against other like hardware components in the photolithography tool.

13. The method of claim 12, wherein the given hardware component comprises a hot plate, and wherein the corrected performance of the hot plate is verified against other hot plates in the photolithography tool.

14. The method of claim 9, wherein E' has shifted outside of the predetermined E' response range, and wherein the method further comprises:
    correlating shift of E' to environmental contamination of the photolithography tool; and
    taking the photolithography tool off-line for maintenance and cleaning.

15. A method for monitoring a photolithographic process, the method comprising:
    performing open frame exposures E0 at varying doses across a surface of at least one wafer coated with a photoresist using a photolithography tool;
    baking and developing the at least one wafer;
    performing a defect inspection of the at least one wafer to generate a haze map;
    grouping haze data from the haze map into columns, wherein each of the columns corresponds to one of the doses;
    analyzing the haze data to identify a maximum E0 response dose E';
    determining whether E' has shifted outside of a predetermined E' response range; and
    taking action to bring E' back into the predetermined E' response range.

16. The method of claim 15, further comprising:
    determining a mean haze data value for each of the doses; and
    using the mean haze data value to identify E' for each wafer exposure.

17. A non-transitory computer program product for monitoring a photolithographic process, the computer program product comprising a computer readable storage medium having program instructions embodied therewith, the program instructions executable by a computer to cause the computer to:
    obtain a haze map from inspection of at least one wafer coated with a photoresist that is processed using a photolithography tool which performs open frame exposures E0 of at least one wafer, and bakes and develops the at least one wafer;
    group haze data from the haze map; and
    analyze the haze data to identify a maximum E0 response dose E'.

18. The non-transitory computer program product of claim 17, wherein the haze data is grouped into columns.

19. The non-transitory computer program product of claim 17, wherein the open frame exposures E0 are performed at varying doses across a surface of the at least one wafer.

20. The non-transitory computer program product of claim 19, wherein the program instructions further cause the computer to:
- determine a mean haze data value for each of the doses; and
- use the mean haze data value to identify E' for each wafer exposure.

* * * * *